United States Patent
Takahashi et al.

(10) Patent No.: US 7,034,617 B2
(45) Date of Patent: Apr. 25, 2006

(54) SEMICONDUCTOR INTEGRATED CIRCUIT FOR HIGH FREQUENCY POWER AMPLIFIER, ELECTRONIC COMPONENT FOR HIGH FREQUENCY POWER AMPLIFIER, AND RADIO COMMUNICATION SYSTEM

(75) Inventors: Kyoichi Takahashi, Fujioka (JP); Shinji Yamada, Takasaki (JP); Masashi Maruyama, Komoro (JP)

(73) Assignee: Renesas Technology Corp., Tokyo (JP)

( * ) Notice: Subject to any disclaimer, the term of this patent is extended or adjusted under 35 U.S.C. 154(b) by 44 days.

(21) Appl. No.: 10/811,388

(22) Filed: Mar. 29, 2004

(65) Prior Publication Data
US 2004/0212432 A1    Oct. 28, 2004

(30) Foreign Application Priority Data
Apr. 22, 2003  (JP)  ............... 2003-116789

(51) Int. Cl.
    *H03G 3/30*    (2006.01)
(52) U.S. Cl. ............... 330/279; 330/129; 330/285
(58) Field of Classification Search ................ 330/129, 330/279, 285
    See application file for complete search history.

(56) References Cited

U.S. PATENT DOCUMENTS 6,172,567 B1 *  1/2001  Ueno et al. .................. 330/285
6,605,999 B1 *  8/2003  Matsushita et al. ......... 330/285
6,759,906 B1 *  7/2004  Matsunaga et al. ......... 330/285

FOREIGN PATENT DOCUMENTS

JP            2000-151310          8/1999

OTHER PUBLICATIONS

"Foundations and Applications of Microwave Circuit", Sogo-Denshi Publisher, 1997, pp. 191-193, with English translation.
U.S. Appl. No. 09/555,010 filed on May 23, 2000, in Japanese (34 pages), along with a verified English translation (64 page).

* cited by examiner

*Primary Examiner*—Khanh V. Nguyen
(74) *Attorney, Agent, or Firm*—Reed Smith LLP; Stanley P. Fisher, Esq.; Juan Carlos A. Marquez, Esq.

(57) ABSTRACT

In a radio communication system, an electronic component for high frequency power amplifier carries out the detection of output level, required for feedback control of the output power of a high frequency power amplification circuit, by current detection. The electronic component has an error amplifier. The error amplifier compares an output level detection signal with an output level instruction signal, and generates a signal for controlling the gain of the high frequency power amplification circuit according to the difference between them. For the error amplifier, a low-pass amplification circuit is used. The amplification circuit is provided with, between its output terminal and its inverting input terminal, a phase compensation circuit. The phase compensation circuit comprises a resistance element, and another resistance element and a capacitive element in series connected in parallel with the resistance element.

13 Claims, 10 Drawing Sheets

FIG. 3
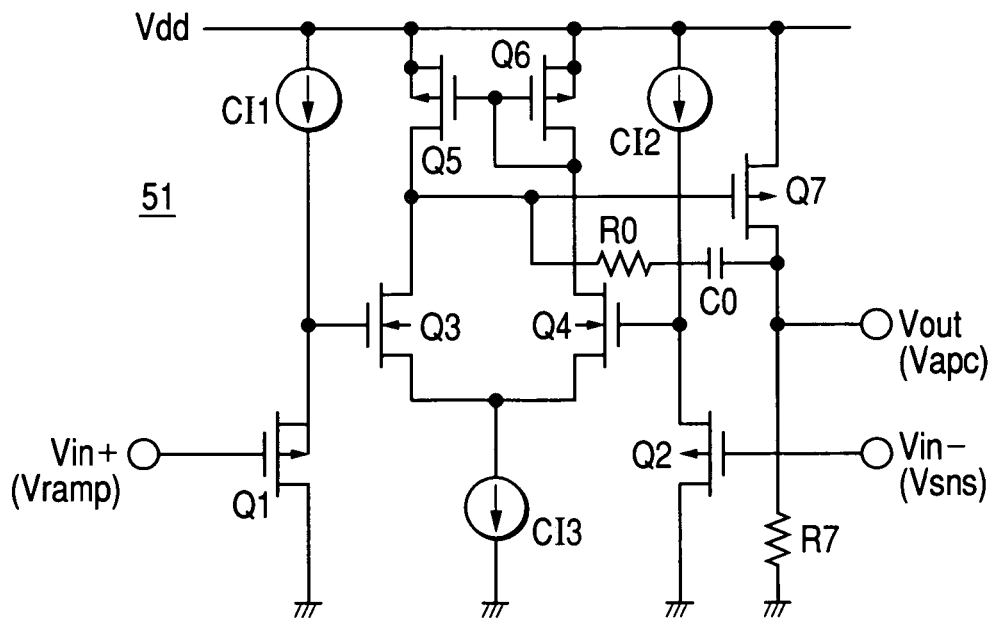
FIG. 4(A) Vramp
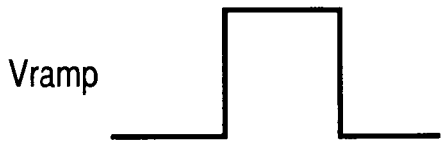
FIG. 4(B) Vsns
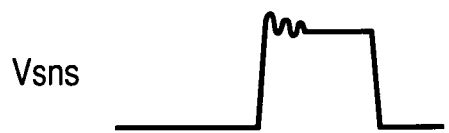
FIG. 4(C) Vsns

SEMICONDUCTOR INTEGRATED CIRCUIT FOR HIGH FREQUENCY POWER AMPLIFIER, ELECTRONIC COMPONENT FOR HIGH FREQUENCY POWER AMPLIFIER, AND RADIO COMMUNICATION SYSTEM

CROSS-REFERENCE TO RELATED APPLICATION

The present application claims priority from Japanese patent application JP 2003-116789 filed on Apr. 22, 2003, the content of which is hereby incorporated by reference into this application.

BACKGROUND OF THE INVENTION

The present invention relates to a technology effectively applied to a high frequency power amplification circuit which is used in a radio communication system, such as cellular phone, and amplifies and outputs high frequency signals and an electronic component and a radio communication system which incorporate the power amplification circuit. More particularly, the present invention relates to a technology for enhancing the stability of control loops and the response to change in request-to-send level in a radio communication system having a detection circuit which performs the detection of output power, required for feedback control of a high frequency power amplification circuit, by current detection.

In general, the transmission-side output portion of radio communication equipment (mobile communication equipment), such as cellular phone, incorporates a high frequency power amplification circuit which amplifies modulated signals. Conventional radio communication equipment is provided with an automatic power control circuit (APC circuit). (Refer to Patent Document 1, for example.) This is for controlling the amplification factor of the high frequency power amplification circuit so as to obtain output power corresponding to the level of a request-to-send from a baseband circuit or a control circuit, such as microprocessor. The APC circuit detects the output level of the high frequency power amplification circuit, and compares the detection signal with a request-to-send level (output level instruction signal). Then, the APC circuit generates an an output control signal Vapc for feedback-controlling the high frequency power amplification circuit. In general, detection of output level is carried out using a coupler, a detector circuit, or the like. The detector circuit is usually constituted as a semiconductor integrated circuit separated from the high frequency power amplification circuit.

The coupler is an element which detects the output level through capacitance produced between an output line (microstrip line) formed on a discrete component or an insulating substrate (module substrate) and an electric conductor placed in parallel with it. The coupler is larger in size than elements formed on a semiconductor chip. The details of coupler (directional coupler) is found in, for example, "*Foundations and Applications of Microwave circuit*" (Sogo-Denshi Publisher, 1997, pp. 191–193).

Output level detection methods for conventional high frequency power amplification circuits use a large number of semiconductor integrated circuits or electronic components separated from the high frequency power amplification circuit. This makes reduction in module size difficult. If a coupler is used, reference voltage is sometimes applied to an end of the coupler for the enhancement of detection sensitivity. In this case, reference voltage must be optimally set and voltage and the like must be adjusted in accordance with variation from component to component. This increases a burden on set makers and is a problem. Use of a coupler also poses another problem: a relatively large power loss is produced.

Consequently, the applicants made an invention related to a radio communication system of current detection type and made an application for it (Japanese Patent Application No. 2000-523757). The radio communication system is provided with transistors for output detection which receive the input signals of transistors for power amplifier for amplifying high frequency signals and pass a current in proportion to the current passed through the transistors for power amplifier. The radio communication system is also provided with current mirror circuits which duplicate the currents in the transistors for output detection. The current duplicated by the current mirror circuits is converted into voltage to obtain a detection signal for output level. The detected output level is compared with the level of a request-to-send, and thus the output level is controlled.

[Patent Document 1]
Japanese Patent Prepublication No. 2000-151310

SUMMARY OF THE INVENTION

FIG. 12 schematically illustrates the configuration of the feedback control system of the high frequency power amplification circuit having an output level detection circuit of current detection type, developed by the applicants. In FIG. 12, numeral 10 denotes a power amplification circuit which amplifies a high frequency signal Pin; numeral 20 denotes a current detection circuit which detects the output level of the power amplification circuit 10 and outputs a current corresponding to the output level; numeral 40 is a current-voltage conversion circuit which converts an output current from the current detection circuit 20 into voltage; a numeral 50 denotes an error amplifier (APC circuit) which compares the output voltage of the current-voltage conversion circuit 40 with an output level instruction signal Vramp supplied from a baseband circuit or a control circuit, such as microprocessor. The feedback control system is so constituted that: a bias voltage corresponding to an input potential difference is generated by the error amplifier 50, and then supplied to the power amplification circuit 10. Thereby, the gain of the power amplification circuit 10 is controlled to control the output power.

The inventors et al. examined the relation between output level instruction signal Vramp and output power Pout in the high frequency power amplification circuit of current detection type, illustrated in FIG. 12. The examination reveled that the relation was as indicated by broken line A2 in FIG. 5(B). As illustrated in the figure, the control sensitivity is high in a region where the level of request-to-send is low, and the output power Pout is drastically changed by slight change in output level instruction signal Vramp.

Consequently, the inventors et al. developed a technology to cope with this. The technology is implemented by providing the above current detection circuit 20 with a characteristic wherein its output is nth root-functionally changed relative to its input. More specifically, as illustrated in FIG. 13, a square root conversion circuit 30 is placed between the current detection circuit 20 and the current-voltage conversion circuit 40. Thus, change in output power Pout relative to output level instruction signal Vramp is made substantially linear, as illustrated by solid line B2 in FIG. 5(B). As a result, the control sensitivity in the region where the request-to-send level is low is enhanced.

The inventors et al. found the following: the high frequency power amplification circuit of current detection type, illustrated in FIG. 12 and FIG. 13, has in itself a lot of points which make a factor responsible for turning the phase as compared with the conventional output level detection type using a coupler. Then, the inventors et al. considered the stability of control loop in the high frequency power amplification circuit of current detection type illustrated in FIG. 12 and FIG. 13.

As the result of the consideration, the inventors et al. found the following: the high frequency power amplification circuit of current detection type in FIG. 12 and FIG. 13 has no problem for closed loop because of its relatively large phase margin. The closed loop is a loop which goes from the error amplifier 50 through the power amplification circuit 10, the current detection circuit 20, (the square root conversion circuit 30), the current-voltage conversion circuit 40 and back to the error amplifier 50. However, the inventors et al. also found the following: the phase margin of open loop is very small and is not more than 45°. The open loop is a loop which goes from the noninverting input terminal of the error amplifier 50 through the current detection circuit 20, (the square root conversion circuit 30), the current-voltage conversion circuit 40 and back to the inverting input terminal of the error amplifier 50. If an output level instruction signal Vramp inputted to the noninverting input terminal of the error amplifier 50 changes, the gain of the power amplification circuit 10 is accordingly changed. This change is returned to the inverting input terminal of the error amplifier 50 through the open loop.

The inventors et al. further found the following: If the phase margin of the open loop is small, a problem arises. If the output level instruction signal Vramp abruptly changes, as illustrated in (A) of FIG. 4, the detection signal Vsns fed back to the inverting input terminal of the error amplifier 50 develops ringing, as illustrated in (B) in FIG. 4. Thus, the response to change in Vramp is unfavorable. Moreover, the inventors et al. found the following: degradation in response due to the small phase margin of the open loop is more remarkable in the high frequency power amplification circuit of current detection type, having the square root conversion circuit 30, in FIG. 13 than in the high frequency power amplification circuit of current detection type in FIG. 12.

An object of the present invention is to provide a high frequency power amplification circuit which, in a radio communication system wherein detection of output level required for the feedback control of the output power of the high frequency power amplification circuit is carried out by current detection, allows the enhancement of the stability of control loop and the response to change in the level of request-to-send, and to provide an electronic component and a radio communication system which incorporate the high frequency power amplification circuit.

Another object of the present invention is to provide a high frequency power amplification circuit which, in a radio communication system wherein detection of output level required for the feedback control of the output power of the high frequency power amplification circuit is carried out by current detection, is capable of lowering the control sensitivity in a region where the level of request-to-send is low, so that the output level can be controlled with accuracy over the entire control range, and allows the enhancement of the stability of control loop and the response to change in the level of request-to-send, and to provide an electronic component and a radio communication system which incorporate the high frequency power amplification circuit.

The above and other objects and features of the invention will be apparent from the following description and the accompanying drawings.

Representative aspects of the present invention disclosed in this application will generally described below:

An electronic component for high frequency power amplifier carries out detection of the output level required for the feedback control of the output power of a high frequency power amplification circuit by current detection. The electronic component has an error amplifier which compares a detection signal for output level with an output level instruction signal, and generates a signal for controlling the gain of the high frequency power amplification circuit according to the difference between the signals. For the error amplifier, a low-pass amplification circuit is used. In the low-pass amplification circuit, a phase compensation circuit comprising a resistance element, and a resistance element and a capacitive element in series which are connected in parallel with the resistance element is placed between the output terminal and inverting input terminal of a differential amplification circuit.

The above-mentioned means increases the phase margin of the open loop. The loop goes from the control-side input terminal (noninverting input terminal) of the error amplifier to which the output level instruction signal is inputted to the high frequency power amplification circuit to the current detection circuit to the current-voltage conversion circuit and back to the feedback-side input terminal (inverting input terminal) of the error amplifier. Since the phase margin of the open loop is increased, the response to change in output level instruction signal can be enhanced. At the same time, the stability of the open loop can be enhanced.

Further preferably, a square root conversion circuit is placed between the current detection circuit and the current-voltage conversion circuit. Provision of the square root conversion circuit lowers the control sensitivity of the high frequency power amplification circuit for output level instruction signals in the region where the level of request-to-send is low. As a result, the output level can be controlled with accuracy over the entire control range. Further, provision of the square root conversion circuit increases an amount of phase turn of the open loop. If this is left intact, the response to change in the level of request-to-send is degraded. However, provision of the phase compensation circuit increases the phase margin of the open loop, and thus the response of the loop to change in output level instruction signal can be enhanced.

BRIEF DESCRIPTION OF THE DRAWINGS

FIG. 3 is a circuit diagram illustrating a concrete example of the differential amplification circuit constituting the error amplifier.

FIG. 4(A)–FIG. 4(C) are waveform charts illustrating the response of detection voltage Vsns to output level instruction signal Vramp in the feedback control system of the high frequency power amplification circuit in the embodiments of the present invention and in the prior invention.

DETAILED DESCRIPTION OF THE PREFERRED EMBODIMENTS

Figure 1:
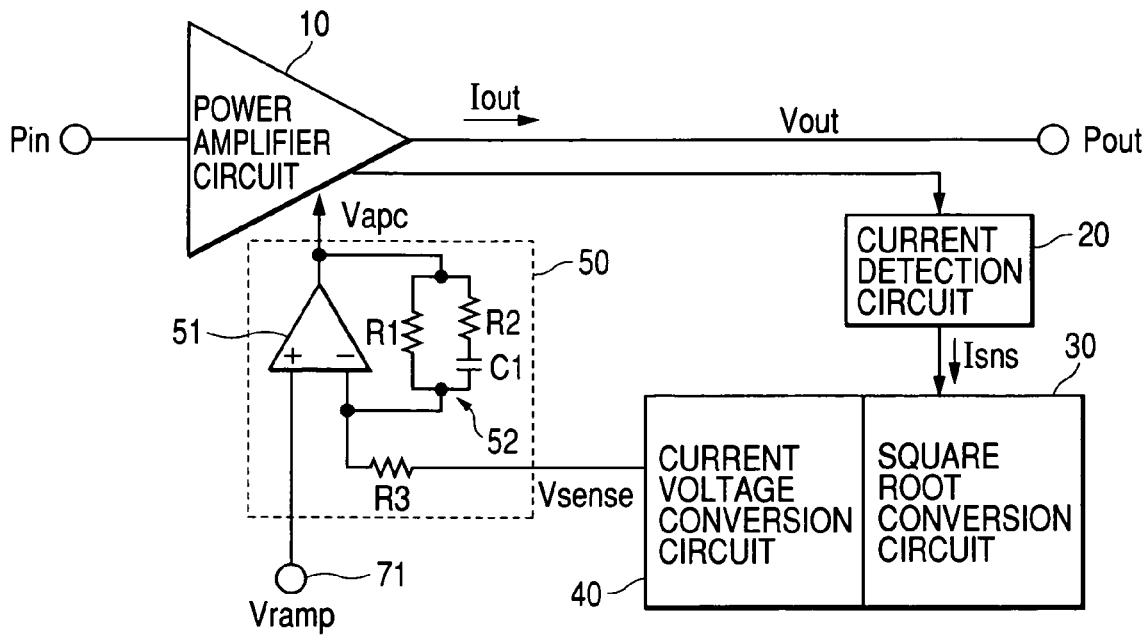
FIG. 1 is a block diagram schematically illustrating the constitution of a first embodiment of the feedback control system of the high frequency power amplification circuit of current detection type to which the present invention is applied.

Referring to the drawings, the preferred embodiments of the present invention will be described below.

FIG. 1 schematically illustrates the constitution of the first embodiment of the feedback control system of the high frequency power amplification circuit of current detection type to which the present invention is applied.

In FIG. 1, numeral 10 denotes a power amplification circuit (power amplifier) which amplifies high frequency signal Pin; numeral 20 denotes a current detection circuit which detects the output level of the power amplification circuit 10 and outputs a current corresponding to it; numeral 30 denotes a square root conversion circuit which converts a current Isns outputted from the current detection circuit 20 into a current Isout which is the second root (square root) of it; numeral 40 denotes a current-voltage conversion circuit which converts the output current Isout of the square root conversion circuit 30 into detection voltage Vsns; and numeral 50 denotes an error voltage detection circuit (error amplifier) which compares the output voltage of the current-voltage conversion circuit 40 with an output level instruction signal Vramp supplied from a baseband circuit or control circuit, such as microprocessor (not shown), and outputs a voltage corresponding to the potential difference between them.

The output voltage of the error amplifier 50 is supplied as bias voltage Vapc to the power amplification circuit 10, and the gain of the power amplification circuit 10 is thereby controlled. As described later, the power amplification circuit 10 is formed by connecting amplifying elements, such as MOSFETs (insulated gate field-effect transistors) and bipolar transistors, in a plurality of stages, though they are not shown in FIG. 1. The bias voltage Vapc from the error amplifier 50 is applied directly to their control terminals (gate terminals or base terminals). Alternatively, a voltage obtained by dividing the bias voltage Vapc from the error amplifier 50 at an appropriate resistance ratio is applied to these control terminals. Thereby, the gain of the power amplification circuit 10 is controlled to adjust the output power. (Refer to FIG. 9.)

In this embodiment, a low-pass amplification circuit is used for the error amplifier 50. In the low-pass amplification circuit, a phase compensation circuit 52 is placed between the output terminal and inverting input terminal of the differential amplification circuit 51. The phase compensation circuit 52 comprises a resistance element R1, and a resistance element R2 and a capacitive element C1 in series which are connected in parallel with the resistance element R1. The phase compensation circuit 52 is not limited to such a circuit as illustrated in FIG. 1, and may be constituted in other ways. An example of such phase compensation circuits is a circuit wherein the resistance element R2 and the capacitive element C1 are inversely connected. Another example is a circuit wherein the resistance element R2 is divided into two and the divided pieces are connected with both ends of the capacitive element C1.

For the resistance elements R1 and R2 and the capacitive element C1 constituting the phase compensation circuit 52, respective constants are set. The constants are so set that the closed loop will have a primary pole in proximity to 50 to 70 kHz and a secondary pole in proximity to 1 MHz. The closed loop goes from the error amplifier 50 through the power amplification circuit 10, the current detection circuit 20, the square root conversion circuit 30, the current-voltage conversion circuit 40, and back to the error amplifier 50. Provision of the resistance element R2 in series with the capacitive element C1 provides the frequency characteristic of the control loop with zero point. The angular frequency of this zero point is set to a value slightly lower than the frequencies of the poles of the power amplification circuit 10. Thereby, the phase margin of the loop is increased. More specifically, the resistance value of the resistance element R1 is set to 40 to 60 kΩ, and that of the resistance element R2 is set to 2 to 5 kΩ. The capacitance of the capacitive element C1 is set to 50 to 100 pF.

For the differential amplification circuit 51, for example, such a differential amplification circuit as illustrated in FIG. 3 is used; however, it is not limited to this. The differential amplification circuit in FIG. 3 comprises an input stage comprising p-channel MOS transistors Q1 and Q2 whose drains are grounded and constant current sources CI1 and CI2 connected in series with them; a differential amplification stage comprising n-channel MOS transistors Q3 and Q4 to the gates of which the source potential of Q1 and Q2 is applied and whose sources are connected together, a source-side constant current source CI3, and a drain-side active load MOS transistors Q5 and Q6; an output stage comprising a source follower output transistor Q7 whose gate is connected with the drain of Q3 and a resistor R7; and a phase compensation circuit comprising a resistor R0 and a capacitor C0 connected in series between the gate and drain of the output transistor Q7.

This phase compensation circuit is a circuit for preventing oscillation of the differential amplification circuit 51 itself. The resistor R0 and the capacitor C0 are elements different from the resistors R1 and R2 and the capacitor C1 in the phase compensation circuit 52. The resistors R1 and R2 and the capacitor C1 are provided for increasing the phase margin of the open loop and closed loop of feedback control loop.

Figure 2:
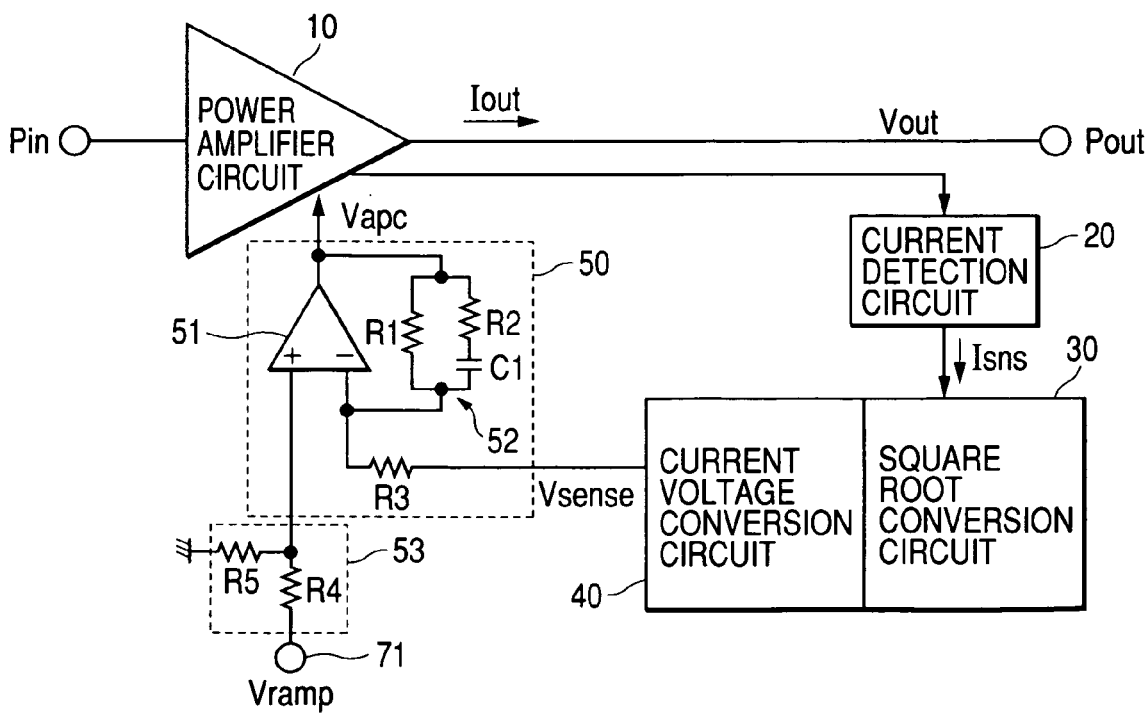
FIG. 2 is a block diagram schematically illustrating the constitution of a second embodiment of the feedback control system of the high frequency power amplification circuit of current detection type to which the present invention is applied.

FIG. 2 schematically illustrates the constitution of the second embodiment of the feedback control system of the high frequency power amplification circuit of current detection type to which the present invention is applied. This embodiment is different from the embodiment in FIG. 1 in that an attenuator (attenuating means) 53 is provided on the noninverting input terminal side of the error amplifier 50. Provision of the attenuator 53 reduces the gain of the control system from the viewpoint of output level instruction signal Vramp.

The attenuator 53 in this embodiment comprises a resistance element R4 placed between a control terminal 71 to which output level instruction signal Vramp is inputted and the noninverting input terminal of the error amplifier 50; and a resistance element R5 placed between the node of the resistance element R4 on the opposite side to the control terminal 71 and a grounding point. Therefore, the attenuator 53 in this embodiment can be considered as resistance type voltage division circuit. For the attenuator 53, one provided with resistance elements similar to the resistance elements R4 and R5 in addition to R4 and R5, or a so-called π-type attenuator may be used.

The resistance elements R4 and R5 constituting the attenuator 53 in this embodiment are set to the same resistance value not more than 100Ω, for example, 43Ω. There is no special restriction on the input resistor R3 for the feedback-side inverting input terminal of the error amplifier 50; however, it is provided with a resistance value of 10 kΩ or so.

Figure 5A:
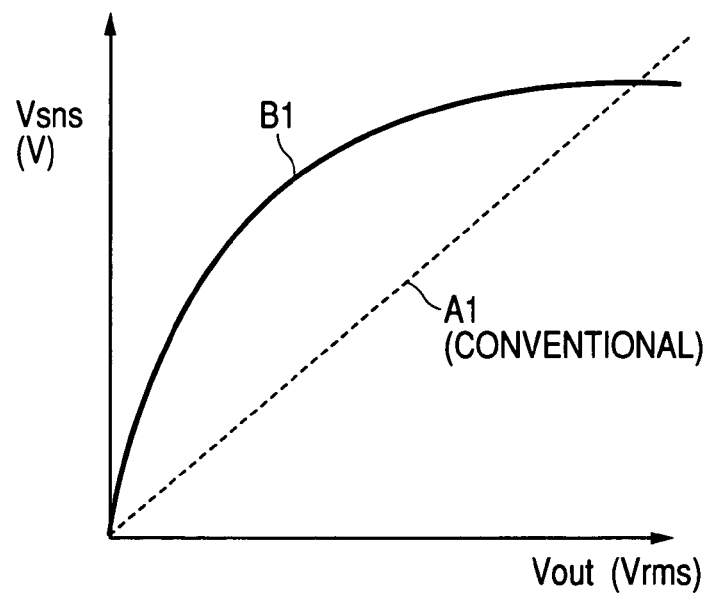
FIG. 5(A) is a characteristic diagram illustrating the relation between the output voltage Vout and detection voltage Vsns of the power amplifier in the feedback control system of the high frequency power amplification circuit in the embodiments of the present invention and in the prior invention.
Figure 5B:
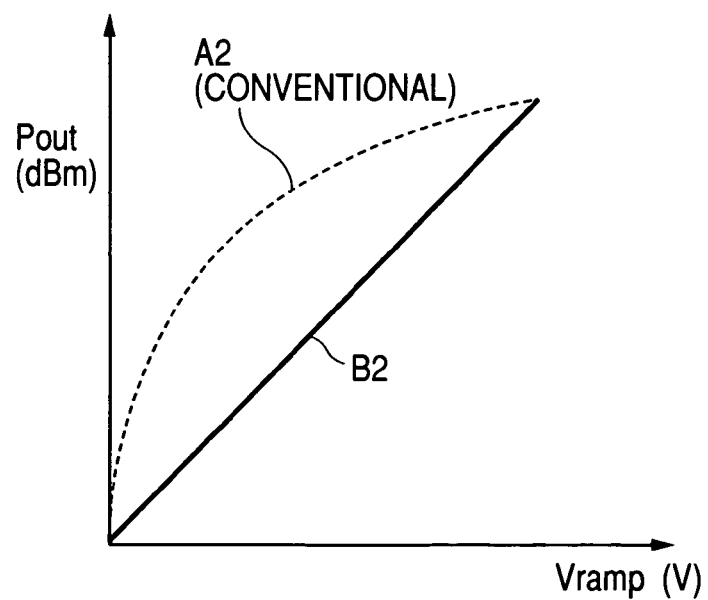
FIG. 5(B) is a characteristic diagram illustrating the relation between the output level instruction signal Vramp and output power Pout in the feedback control system of the high frequency power amplification circuit in the embodiments of the present invention and in the prior invention.

In FIG. 5(A), the relation between output voltage Vout and the output voltage (detection voltage) Vsns of the current-voltage conversion circuit 40 in the first and second embodiments is indicated by solid line B1. In FIG. 5(B), the relation between output level instruction signal Vramp and output power Pout in the control system in the first and second embodiments is indicated by solid line B2.

Figure 12:
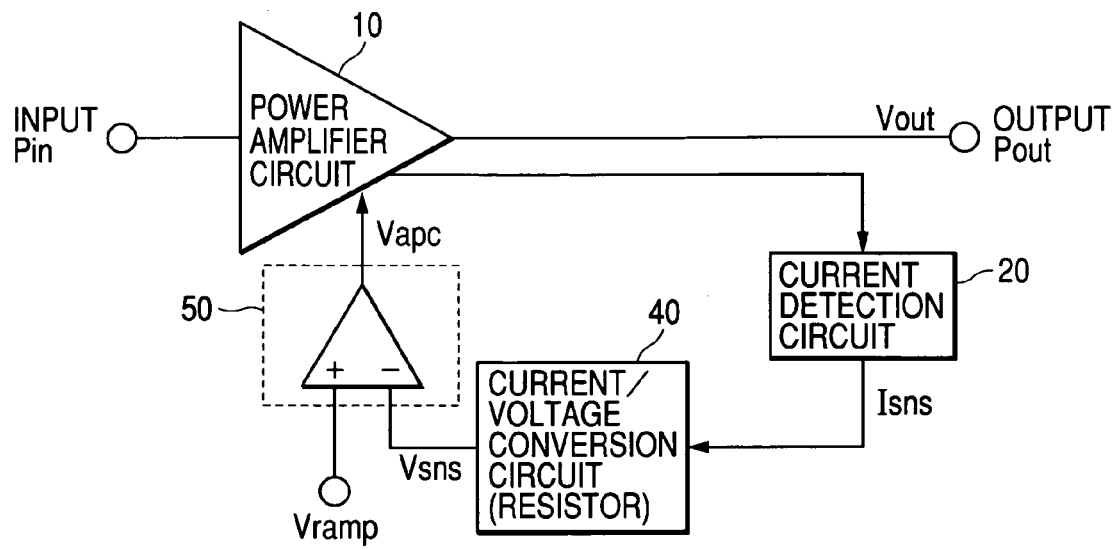
FIG. 12 is a block diagram schematically illustrating the configuration of the feedback control system of the high frequency power amplification circuit of current detection type the applicants previously developed.
Figure 13:
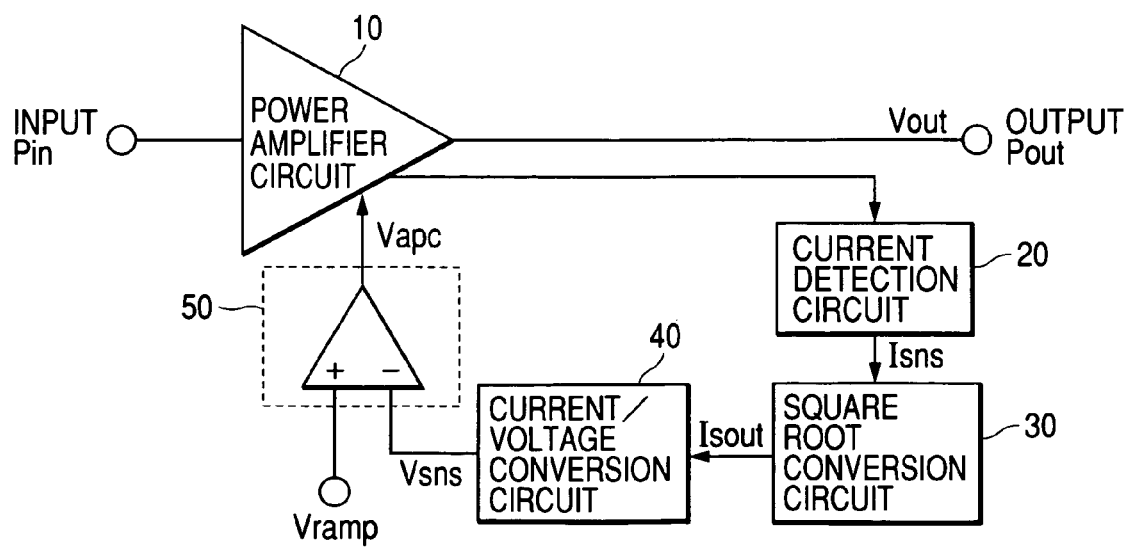
FIG. 13 is a block diagram schematically illustrating the configuration of the feedback control system of the high frequency power amplification circuit of current detection type having a square root conversion circuit which was studied prior to the present invention.

Indicated by broken line A1 in FIG. 5(A) is the relation between output voltage Vout and the output voltage Vsns of the current-voltage conversion circuit 40 in the control system illustrated in FIG. 12. This control system is not provided with the square root conversion circuit 30 in the first embodiment. Indicated by broken line A2 in FIG. 5(B) is the relation between output level instruction signal Vramp and output power Pout in the control system illustrated in FIG. 12.

As seen from FIG. 5(A), provision of the square root conversion circuit 30 increases the degree of change in the output voltage Vsns of the current-voltage conversion circuit 40 relative to output level Vout in a region where the level of output power Pout is low. Thus, even if the output power Pout is greatly changed relative to output level instruction signal Vramp in a region where the request-to-send level is low, no problem arises. That is, the control sensitivity of the high frequency power amplification circuit 10 to output level instruction signals in a region where the request-to-send level is low is reduced. As a result, the output power of the high frequency power amplification circuit 10 can be controlled with accuracy over the entire control range.

Figure 6A:
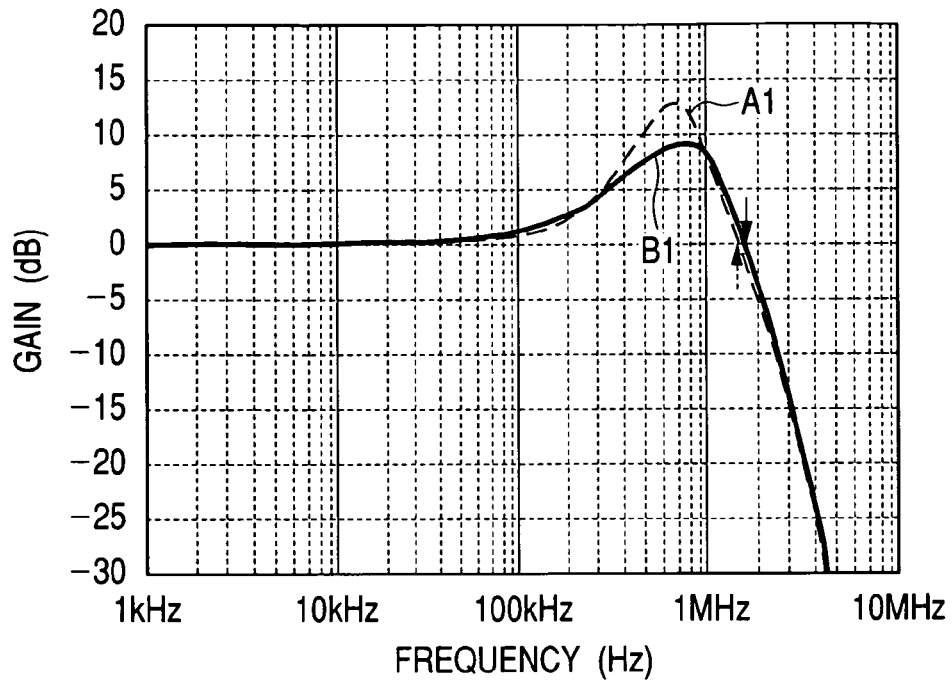
FIG. 6(A) is a graph showing the frequency characteristic of the gain of the output voltage (detection voltage) Vsns of the current-voltage conversion circuit 40 with respect to output level instruction signal Vramp in the control system in the first embodiment.
Figure 6B:
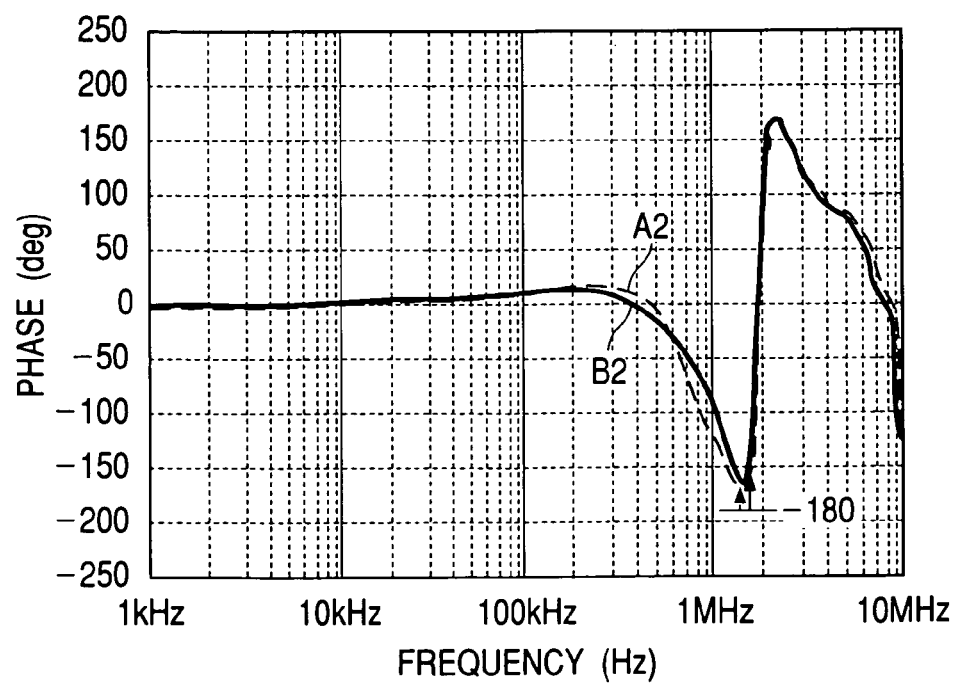
FIG. 6(B) is a graph showing the frequency characteristic of the phase of Vsns with respect to Vramp in the control system in the first embodiment.

In FIG. 6(A), the frequency characteristic of the gain of the output voltage (detection voltage) Vsns of the current-voltage conversion circuit 40 relative to output level instruction signal Vramp in the control system in the first embodiment is indicated by solid line B1. In FIG. 6(B), the frequency characteristic of the phase of the open loop in the control system in the first embodiment is indicated by solid line B2. These frequency characteristics were obtained when the following setting was made: the resistance value of the resistance element R1 in the phase compensation circuit 52 of the error amplifier 50 is 10 kΩ; that of the resistance element R2 is 47 kΩ; that of the resistance element R3 is 2 kΩ; and the capacitance of the capacitor C1 is 82 pF.

Indicated by broken lines A1 and A2 in FIGS. 6(A) and 6(B) are the frequency characteristic of the gain of Vsns relative to Vramp and the frequency characteristic of the phase of open loop. These frequency characteristics are obtained when a circuit consisting only of the capacitor C1 and the resistance element R1 is used for the phase compensation circuit of the error amplifier 50 in the control system in FIG. 12. In FIG. 6(A), the frequency f0 when broken line A1 crosses 0 dB is 1.38 MHz, and the frequency f0 when solid line B1 crosses 0 dB is 1.53 MHz.

According to simulation, the phase margin (difference between phase delay angle when the gain is 0 dB and −180) in the control system in FIG. 12 at this time was approximately 25°. Meanwhile, in the control system in this embodiment wherein a circuit provided with the resistance element R2 in series with the capacitor C1 in addition to the capacitor C1 and the resistance element R1 was used for the phase compensation circuit 52, the phase margin was approximately 46°.

It is generally said that when the phase margin of a loop is not more than 45°, the stability of oscillation cannot be ensured. However, application of the first embodiment improves the phase margin of open loop in the feedback control system of the high frequency power amplification circuit using the square root conversion circuit 30, illustrated in FIG. 1. Thus, the stability of oscillation can be ensured. As the result, the following advantage is produced: even if the output level instruction signal Vramp abruptly changes, as illustrated in (A) of FIG. 4, the detection signal Vsns fed back to the inverting input terminal of the error amplifier 50 does not develop ringing as (C) of FIG. 4. Thus, the response of loop to output level instruction signal Vramp is enhanced.

Figure 7A:
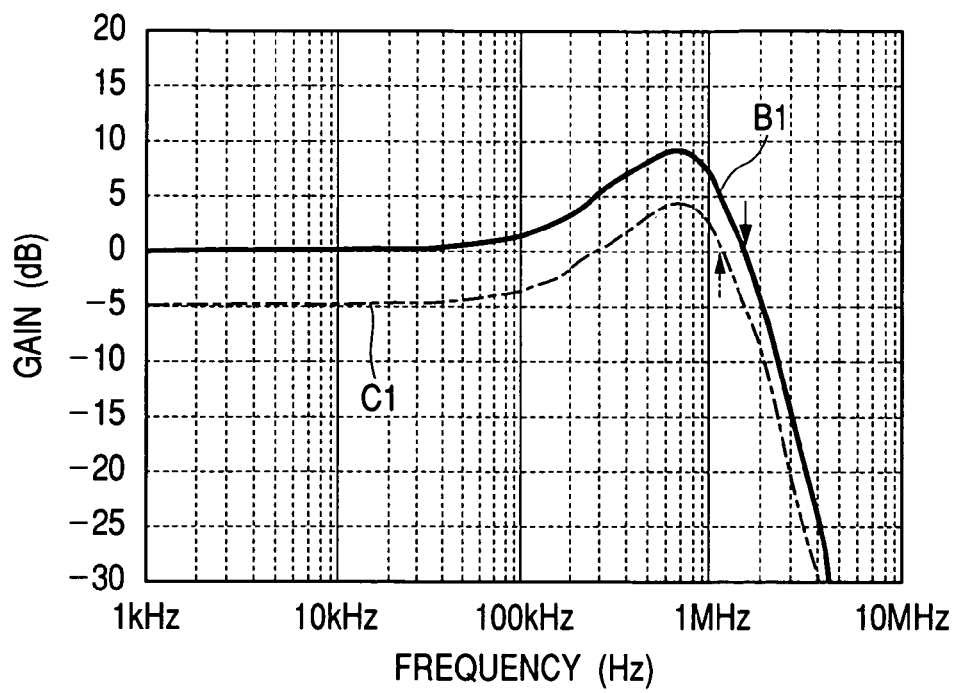
FIG. 7(A) is a graph showing the frequency characteristic of the gain of the output voltage (detection voltage) Vsns of the current-voltage conversion circuit 40 with respect to output level instruction signal Vramp in the control system in the second embodiment.
Figure 7B:
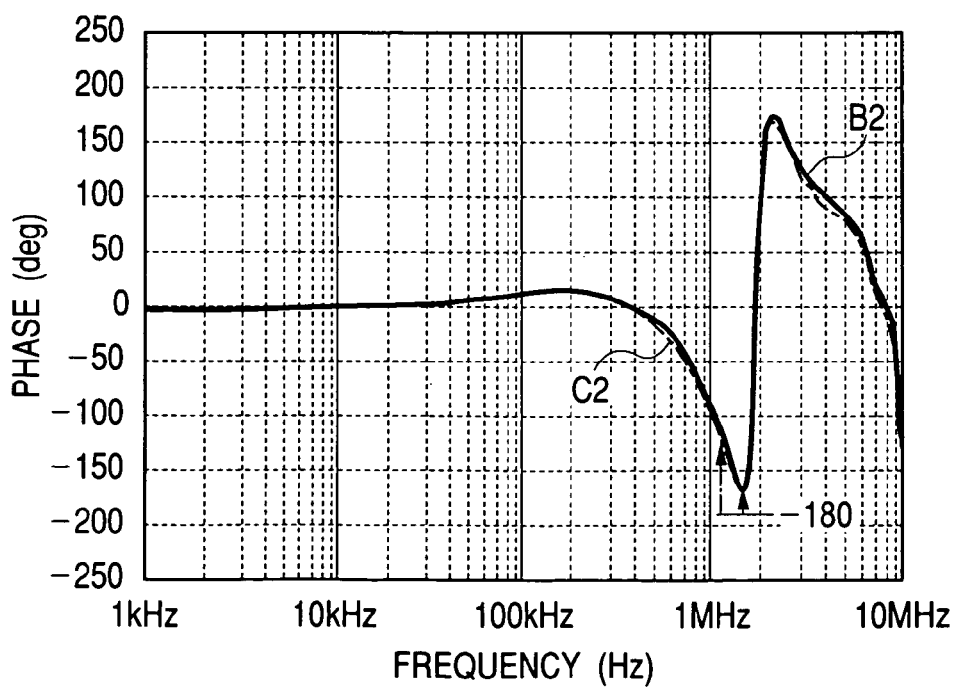
FIG. 7(B) is a graph showing the frequency characteristic of the phase of Vsns with respect to Vramp in the control system in the second embodiment.

In FIG. 7(A), the frequency characteristic of the gain of the output voltage (detection voltage) Vsns of the current-voltage conversion circuit 40 relative to output level instruction signal Vramp in the control system in the second embodiment illustrated in FIG. 2 is indicated by alternate long and short dash line C1. In FIG. 7(B), the frequency characteristic of the phase of open loop in the control system in the second embodiment is indicated by alternate long and short dash line C2. These frequency characteristics were obtained when the following setting was made: the resistance value of the resistor R1 in the phase compensation circuit 52 of the error amplifier 50 is 10 kΩ; that of the resistor R2 is 47 kΩ; that of the resistor R3 is 2 kΩ; the capacitance of the capacitor C1 is 82 pF; and the resistance value of the resistors R4 and R5 in the attenuator 53 is 43 kΩ.

Indicated by solid lines B1 and B2 in FIGS. 7(A) and 7(B) are the frequency characteristic of the gain of Vsns relative to Vramp in the control system in the first embodiment illustrated in FIG. 1, and the frequency characteristic of the phase of open loop. These are the same characteristics as indicated by solid lines in FIGS. 6(A) and 6(B) In FIG. 7(A), the frequency f0 when solid line C1 crosses 0 dB is 1.16 MHz. The frequency f0 when solid line B1 crosses 0 dB is 1.53 MHz, as mentioned above.

According to simulation, the phase margin of open loop in the control system in the second embodiment wherein the attenuator 53 is provided on the noninverting input terminal side of the error amplifier 50 was approximately 66°. As mentioned above, the phase margin of open loop in the feedback control system of the frequency power amplification circuit in the first embodiment is 46°. Therefore, provision of the attenuator 53 makes the stability of oscillation more favorable, and further enhances the response of loop to output level instruction signal Vramp.

Figure 8A:
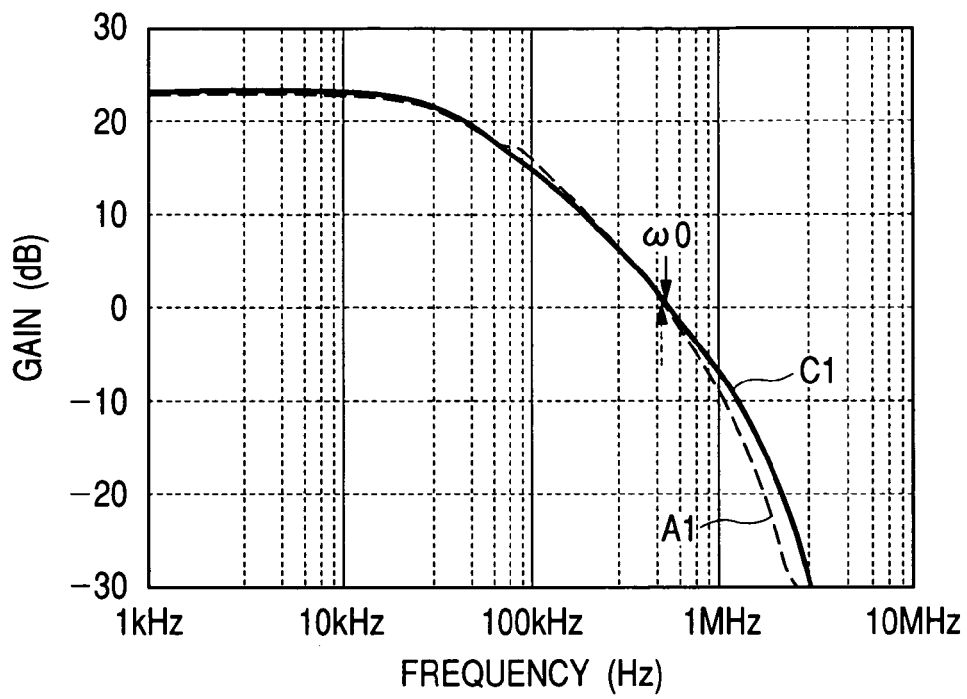
FIG. 8(A) is a graph showing the frequency characteristic of the gain of the closed loop in the control system in the second embodiment.
Figure 8B:
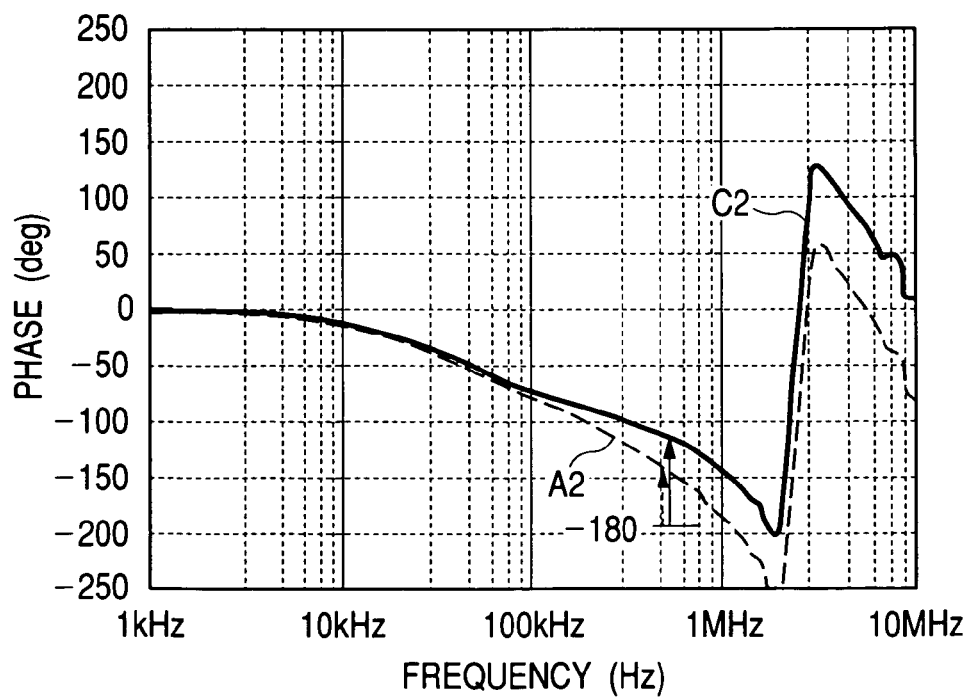
FIG. 8(B) is a graph showing the frequency characteristic of the phase of the closed loop in the control system in the second embodiment.

In FIG. 8(A), the frequency characteristic of the gain of closed loop in the control system in the second embodiment illustrated in FIG. 2 is indicated by solid line C1. The closed loop goes from the error amplifier 50 through the power amplification circuit 10, the current detection circuit 20, the square root conversion circuit 30, the current-voltage conversion circuit 40, and back to the error amplifier 50. In FIG. 8(B), the frequency characteristic of the phase of closed loop in the control system in the second embodiment is indicated by solid line C2. These frequency characteristics were obtained when the following setting was made: the resistance value of the resistor R1 in the phase compensation circuit 52 of the error amplifier 50 is 10 kΩ; that of the resistor R2 is 47 kΩ; that of the resistor R3 is 2 kΩ; and the capacitance of the capacitor C1 is 82 pF.

Indicated by broken lines A1 and A2 in FIGS. 8(A) and 8(B) are the frequency characteristic of the gain of Vsns relative to Vramp and the frequency characteristic of the phase of closed loop. These frequency characteristics are obtained when in the control system illustrated in FIG. 12, a circuit consisting only of the capacitor C1 and the resistor R1 is used for the phase compensation circuit 52 of the error amplifier 50. The figures show that the phase margin of closed loop in the control system in the second embodiment is 65° and the stability of oscillation of closed loop is sufficient.

Figure 9:
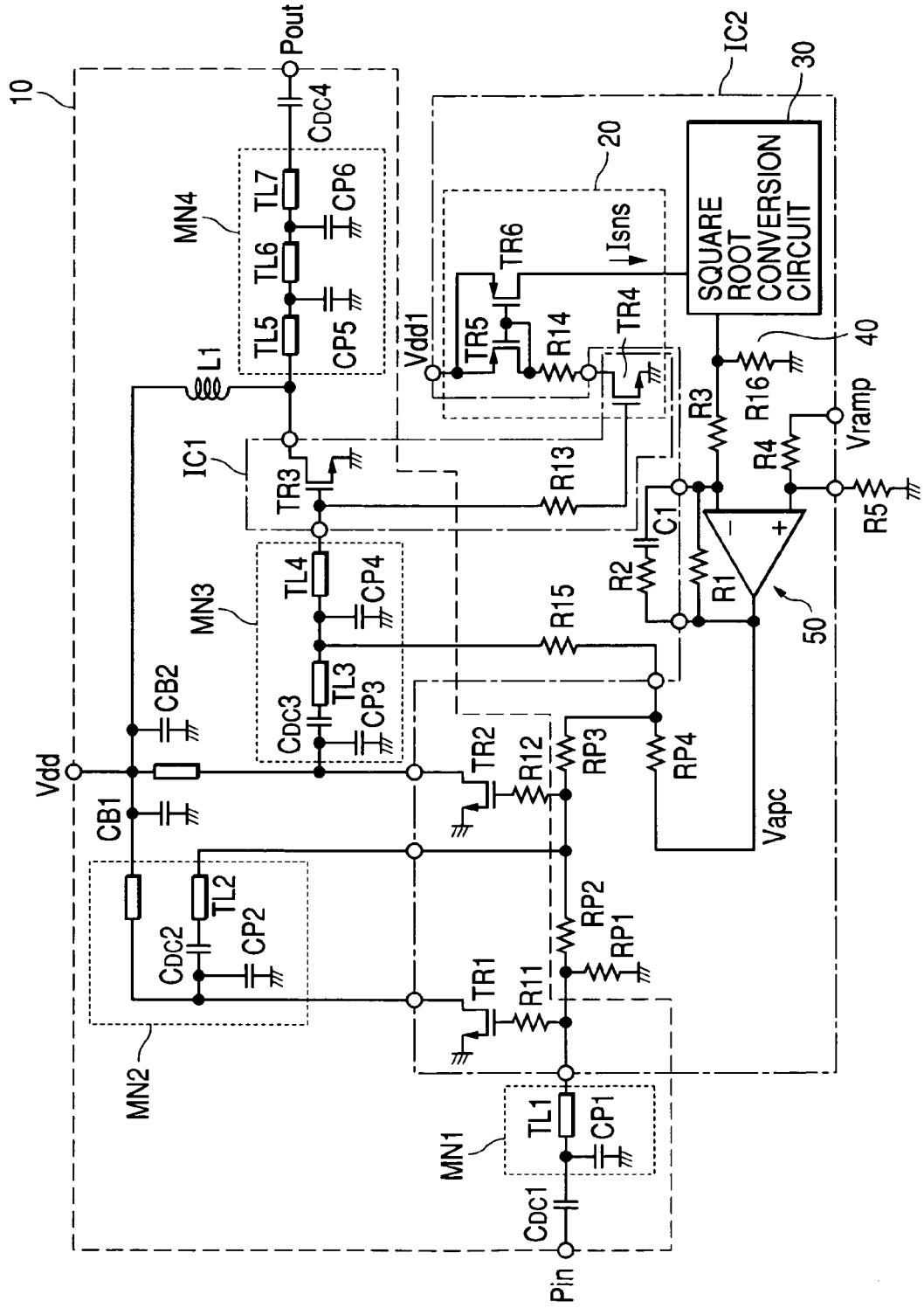
FIG. 9 is a circuit diagram illustrating a concrete example of the constitution of the high frequency power amplification circuit of current detection type to which the present invention is applied.

FIG. 9 illustrates an example of more concrete circuitry than the embodiment in FIG. 2. In FIG. 9, numeral 10 denotes a high frequency amplification circuit portion which amplifies and outputs input high frequency signals Pin. The high frequency amplification circuit 10 comprises three amplification stages in cascade connection.

More specifically, a high frequency signal Pin inputted is supplied to the gate terminal of a transistor TR1 for power amplifier constituting the first amplification stage through an impedance matching circuit MN1 and a resistor R11. The signal amplified by TR1 is supplied from the drain terminal of TR1 to the gate terminal of a transistor TR2 for power amplifier constituting the second amplification stage through an impedance matching circuit MN2 and a resistor R12.

Further, the signal amplified by the transistor TR2 is supplied from the drain terminal of TR2 to the gate terminal of a transistor TR3 for power amplifier constituting the third amplification stage through an impedance matching circuit MN3. The signal amplified by TR3 is outputted from the drain terminal of TR2 through an impedance matching circuit MN4.

Capacitive elements CDC1, CDC2, CDC3, and CDC4 for cutting the direct-current component are placed between the input terminal and the impedance matching circuit MN1, between the amplification stages, and between the impedance matching circuit MN4 and the output terminal. The impedance matching circuits MN1 to MN4 respectively comprise capacitors CP1 to CP6 and transmission lines TL1 to TL7.

In this embodiment, MOSFET is used for the transistors TR1 to TR3 for power amplifier in the respective amplification stages. However, other transistors may be used. Such transistors include bipolar transistor, GaAsMESFET, heterojunction bipolar transistor (HBT), and HEMT (High Electron Mobility Transistor).

The current detection circuit 20 comprises a transistor TR4 for output detection to the gate terminal of which the same signal as the input signal of the transistor TR3 for power amplifier in the final amplification stage of the high frequency amplification circuit 10 is applied through a resistor R13; a transistor TR5 for current mirror connected in series with the transistor TR4 through a resistor R14; and a transistor TR6 connected with the transistor TR5 in current mirror configuration. By setting an appropriate value n for the size ratio between the transistors TR3 and TR4 (e.g. n=10), a current equivalent to 1/n of the collector current of TR3 is passed through the transistors TR4. The current of the transistor TR4 is duplicated onto the transistor TR6 by the current mirror circuit. Thus, the drain current passed through the transistor TR6 is turned into a current Isns which is correlated with the output power of the transistor TR3 for power amplifier. The size ratio between the transistors TR5 and TR6 for current mirror is set to, for example, 1:1.

This current Isns is converted by the square root conversion circuit 30, and the current Isout obtained by this conversion is passed through a resistor R16 as a means for current-voltage conversion. Thereby, the current is converted into a detection voltage Vsns corresponding to output level. The detection voltage Vsns is supplied to the error amplifier 50, and is compared there with an output level instruction signal Vramp supplied from a baseband circuit or the like. Then, a voltage Vapc corresponding to the difference between Vsns and Vramp is outputted from the error amplifier 50. Vapc is divided through the resistors RP1 to RP4, and applied as bias voltage to the gate terminals of the above transistors TR1 and TR2 for power amplifier. Thus, the output power is controlled.

The gate bias of the transistor TR3 for power amplifier in the final stage is indirectly supplied. This is done by the potential of the connection node between the dividing resistors RP3 and RP4 being transferred to an internal node of the impedance matching circuit MN3 through a resistor R15. Alternatively, the voltage divided through the resistors RP3 and RP4 may be supplied directly to the gate of the transistor TR3 for power amplifier in the final stage through the resistor R15.

The areas encircled with alternate long and short dash lines and marked with IC1 and IC2 in FIG. 9 indicate that the circuits and elements in the areas are separately formed on respective semiconductor chips. More specifically, the transistor TR3 for power amplifier in the final stage and the transistor TR4 for current detection are formed together with the resistor R13 on one and the same semiconductor chip. This constitutes a first semiconductor integrated circuit IC1.

The transistors TR1 and TR2 for power amplifier in the first and second stages are formed on one and the same semiconductor chip. The current detection circuit 20 (excluding the transistor TR4), the square root conversion circuit 30, the current-voltage conversion circuit 40, and the error amplifier 50 are also formed on the same semiconductor chip. This constitutes a second semiconductor integrated circuit IC2. The resistor R2 and the capacitor C1 constituting the error amplifier 50 and the resistor R5 constituting the attenuator 53 are connected as elements external to the second semiconductor integrated circuit IC2. Thus, the frequency characteristic can be adjusted according to the system used.

With respect to the circuit illustrated in FIG. 9, the discrete components, such as the semiconductor chips IC1 and IC2, the resistors R2 and R5, and the capacitor C1, are mounted on one insulating substrate. Thus, the entire circuit illustrated in FIG. 9 is constituted as a module. With respect to this specification, "module" is defined as follows: printed wiring is formed on the surfaces and in the interior of an insulating substrate, such as a ceramic substrate. A plurality of semiconductor chips and discrete components are mounted on the insulating substrate. Then, these components are jointed together through the above printed wiring or bonding wires so that they will fulfill predetermined roles. Thus, they can be handled as if they were one electronic component. This is referred to as "module."

In this module, the transmission lines TL1 to TL7 which constitute the impedance matching circuits MN1 to MN4 can be formed by a conductor layer, called microstrip line, formed on the insulating substrate. If the insulating substrate is constituted by laminating a plurality of dielectric layers, the capacitors CP1 to CP6 constituting the impedance matching circuits MN1 to MN4 can be formed as follows: the capacitors CP1 to CP6 can be constituted utilizing capacitors formed between any dielectric layer and the conductor layers formed on the front face and the underside of the dielectric layer.

Figure 10:
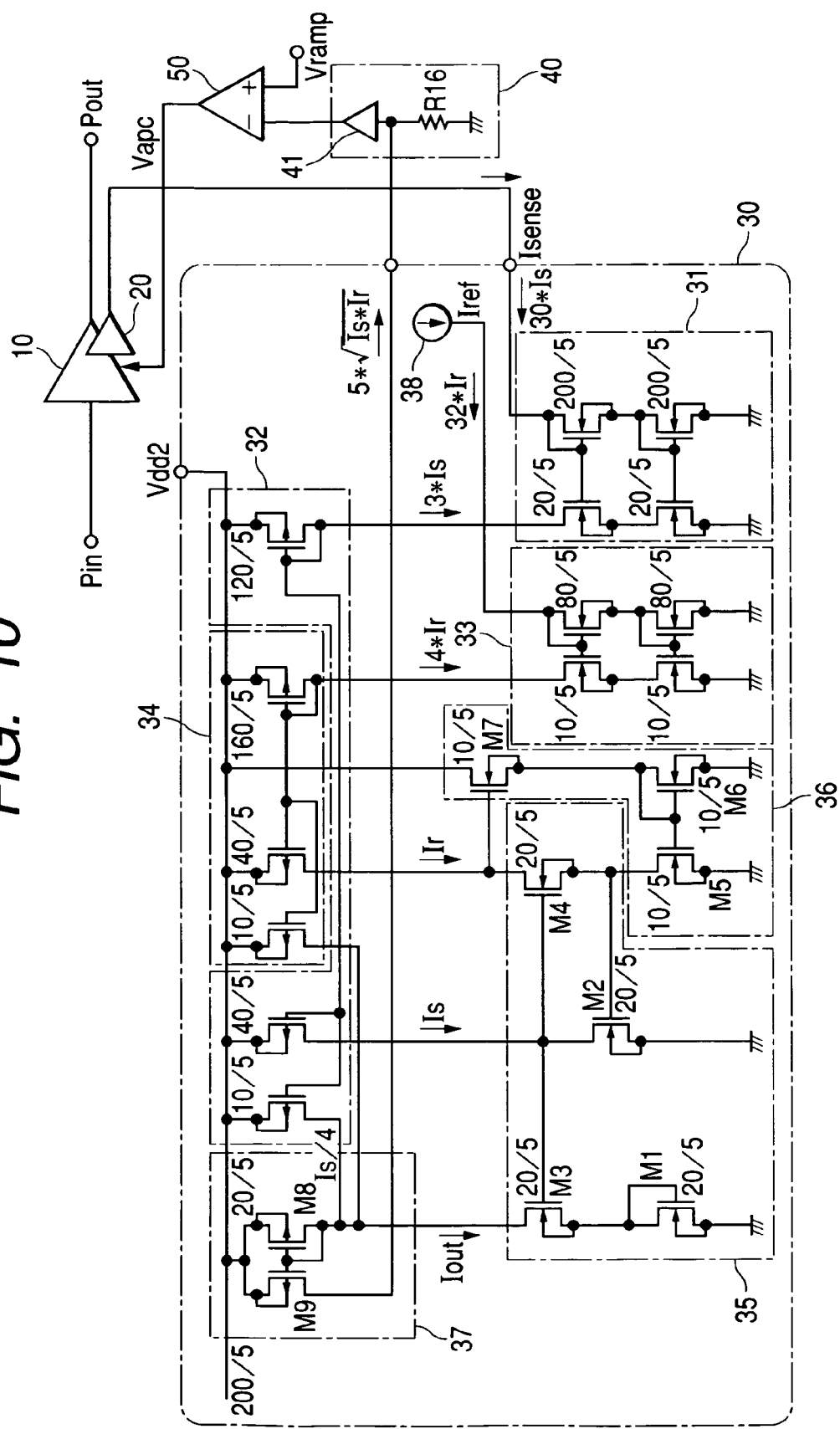
FIG. 10 is a circuit diagram illustrating an concrete example of the square root conversion circuit in the embodiments.

FIG. 10 illustrates a concrete example of the square root conversion circuit 30.

The square root circuit in this embodiment comprises a first current mirror circuit 31 comprising n-channel MOSFETs which proportionally reduces a detection current Isns outputted from the current detection circuit 20; a second current mirror circuit 32 comprising n-channel MOSFETs which further proportionally reduces the current duplicated by the first current mirror circuit 31; a third current mirror circuit 33 comprising p-channel MOSFETs which proportionally reduces a reference current Iref from a constant current source 38; a fourth current mirror circuit 34 comprising p-channel MOSFETs which further proportionally reduces the current duplicated by the third current mirror circuit 33; an arithmetic circuit 35 which uses the currents generated by these current mirror circuits to generate a current including a term corresponding to the square root of the detection current Isns; a bias circuit 36 which comprises MOSFET M5 which is connected in series with MOSFET M4 constituting the arithmetic circuit 35 and through which the same current as in M4 is passed, MOSFET M6 connected with M5 in current mirror configuration, and MOSFET M7 connected in series with M6, and supplies an operating point for MOSFETs M2 and M4 constituting the arithmetic circuit 35 by the drain voltage of M4 being applied to the gate of MOSFET M7; and a current synthesis circuit 37 which uses currents generated by the current mirror circuits 32 and 34 to subtract a current corresponding to extra terms other than the term of square root from the current containing the term corresponding to square root generated by the arithmetic circuit 35, and outputs a current in proportion to the square root of the detection current Isns.

With respect to the individual current mirror circuits 31 to 34, a predetermined value is set for the size ratio (ratio of gate width) of each pair of MOSFETs with their gates connected together. The current mirror circuits 31 to 34 thereby generate proportionally reduced currents. More specifically, the size ratio (ratio of gate width) of each pair of MOSFETs is set to a predetermined value so that the following results will be obtained: a current reduced to $1/10$ will be generated with respect to the first current mirror circuit 31; currents reduced to $1/3$ and $1/12$ will be generated with respect to the second current mirror circuit 32; a current reduced to $1/8$ will be generated with respect to the third current mirror circuit 33; and currents reduced to $1/4$ and $1/16$ will be generated with respect to the fourth current mirror circuit 34.

The current equivalent to $1/30$ of the detection current Isns inputted to the square root conversion circuit 30 is let to be Is; and the current equivalent to $1/32$ of the reference current Iref from the constant current source 38 is let to be Ir. Thus, the currents passed through the destinations of duplication by the first current mirror circuit 31 and the third current mirror circuit 33 are 3Is and 4Ir, respectively. The currents let to flow to the arithmetic circuit 35 from the destinations of duplication by the second current mirror circuit 32 and the fourth current mirror circuit 34 are Is and Ir, respectively.

The arithmetic circuit 35 comprises MOSFET M2 wherein the current Is supplied from the second current mirror circuit 32 is passed between drain and source; MOSFET M4 to the gate terminal of which the drain voltage of MOSFET M2 is applied and wherein the current Ir supplied from the fourth current mirror circuit 34 is passed between drain and source; MOSFET M3 to the gate terminal of which the drain voltage of MOSFET M2 is applied and which passes the current of the origin of duplication of the current synthesis circuit 37; and MOSFET M1 connected with the source side of MOSFET M3 in series with M3. With respect to MOSFET M1, the gate and the drain are joined with each other so that MOSFET M1 will act as diode. MOSFETs M1 to M4 are so designed that their size (gate width W and gate length L) is identical. MOSFETs M1 to M4 are simultaneously manufactured by the same process, and thus have the same threshold voltage Vth. Further, the supply voltage Vdd2 is so set that MOSFETs M1 to M4 will operate in saturation region.

Here, the gate-source voltages of MOSFETs M1, M2, M3, and M4 are let to be VGS1, VGS2, VGS3, and VGS4, and their drain-source voltages are let to be VDS1, VDS2, VDS3, and VDS4. Then, the node N1 of the arithmetic circuit 35 is considered. The potential Vn1 of the node N1 is determined by Vn1=VGS1+VGS3 from the viewpoint of MOSFETs M1 and M3, and by Vn1=VGS2+VGS4 from the viewpoint of MOSFETs M2 and M4. Since both the potentials are equal, VGS1+VGS3=VGS2+VGS4.

MOSFETs M1 and M3 are connected in series; therefore, the currents passed through them are equal (Iout in the figure). The current Is from the current mirror circuit 32 is passed through MOSFET M2, and the current Ir from the current mirror circuit 34 is passed through MOSFET M4. Therefore, the above equation is expressed by Equation (1) using an equation representing the drain current characteristics in saturation region of MOSFETs.

$$2[Vth+\sqrt{\{(2/\beta)\cdot(L/W)/(1+\lambda\cdot VDS)\}}\cdot\sqrt{Iout}]=Vth+ \\ \sqrt{\{(2/\beta)\cdot(L/W)/(1+\lambda\cdot VDS)\}}\cdot\sqrt{Is}+Vth+ \\ \sqrt{\{(2/\beta)\cdot(L/W)/(1+\lambda\cdot VDS)\}}\cdot\sqrt{Ir} \quad (1)$$

In the above equation, the element size L/W of the individual MOSFETs M1 to M4 is equal, and $\lambda\cdot VDS$ is negligibly small relative to the equation (1) because of the element characteristics of MOSFETs. Therefore, the above equation can be rewritten as follow:

$$\sqrt{Iout}=(\sqrt{Is}+\sqrt{Ir})/2 \quad (2)$$

When this equation is transformed, $$Iout=(Is+Ir)/4+\sqrt{(Is\cdot Ir)}/2 \quad (3)$$

Though an extra term, (Is+Ir)/4, is included, the current Iout passed through MOSFET M3 is expressed by the square root of the detection current Is, as seen from this equation.

In addition, the circuit in the embodiment illustrated in FIG. 10 is provided with the current synthesis circuit 37 comprising current mirror MOSFETs M8 and M9 whose gates are connected together. This circuit is so constituted that it will perform the following operation: the circuit outputs as Iout a current obtained by adding the current of Is/4 supplied from the second current mirror circuit 32 and the current of Ir/4 supplied from the fourth current mirror circuit 34 to the current passed through MOSFET M8 which is the origin of duplication in current mirror operation. MOSFETs M8 and M9 are so designed that their size ratio will be 1:10. Thus, a current whose magnitude is 10 times that of a current smaller by (Is+Ir)/4 than Iout is passed through MOSFET M9 connected with MOSFET M8 in current mirror configuration.

It is understood that the current of (Is+Ir)/4 obtained by addition by the current synthesis circuit 37 corresponds to the first term in Equation (3) above. Therefore, the current passed through MOSFET M9 is 10 times the second term in Equation (3), that is, $10\cdot\sqrt{(Is\cdot Ir)}/2=5\cdot\sqrt{(Is\cdot Ir)}$. The circuit in the embodiment illustrated in FIG. 10 is so constituted that this current will be outputted. Therefore, the output current of this circuit is a current in proportion to the square root of Is.

As mentioned above, the current Is is 1/30 of the detection current Isns of the current detection circuit 20. Therefore, the output current of the circuit in FIG. 10 is a current in proportion to the square root of the detection current Isns of the current detection circuit 20. This current is let to flow to the resistor R16 in the current-voltage conversion circuit 40, and is converted there into voltage. The voltage obtained by this conversion is subjected to impedance conversion, and is supplied to the error amplifier 50.

Equation (3) does not contain a temperature coefficient, and the output current does not have temperature dependence. Therefore, the operating characteristics of the square root circuit in this embodiment are constant even if the ambient temperature changes, as long as the reference current Iref is constant. Thus, conversion can be carried out with stability. For the constant current source whose current is constant even if the temperature changes, a constant current circuit wherein temperature compensation is implemented by combining an element having positive temperature characteristics and an element having negative temperature characteristics is known. Such a constant current circuit that does not have temperature dependence is utilized as the current source 38. Thereby, a suitable reference current Iref can be generated and supplied to the square root circuit in this embodiment.

In the circuit in the embodiment in FIG. 10, circuits wherein MOSFET pairs each connected in current mirror configuration are vertically stacked in two stages are used as the first current mirror circuit 31 and the third current mirror circuit 33. This is for reducing the supply voltage dependence of currents generated. Therefore, if highly stable voltage is supplied as the operating voltage Vdd2 for the square root conversion circuit 30, one-stage current mirror circuits similar to the current mirror circuits 32 and 34 on the p-MOS side may be adopted.

In the embodiment in FIG. 10, a current obtained by adding the currents Is/4 and Ir/4 from the current mirror circuits 32 and 34 to the current outputted from MOSFET M8 in the current mirror circuit 37 is passed through as the current Iout of the arithmetic circuit 35. This is for eliminating the extra term of current (Is+Ir)/4 other than the term of $\sqrt{(Is\cdot Ir)}$ from the output current. Instead of adding the currents Is/4 and Ir/4 to the current outputted from MOSFET M8, another constitution may be adopted. In this case, MOSFETs which are connected with the MOSFETs constituting the current mirror circuits 31 and 32 in current mirror configuration and pass proportionally reduced current are provided. Thus, the current obtained by subtracting the currents Is/4 and Ir/4 from the current outputted from MOSFET M9 is passed through the resistor R16.

Figure 11:
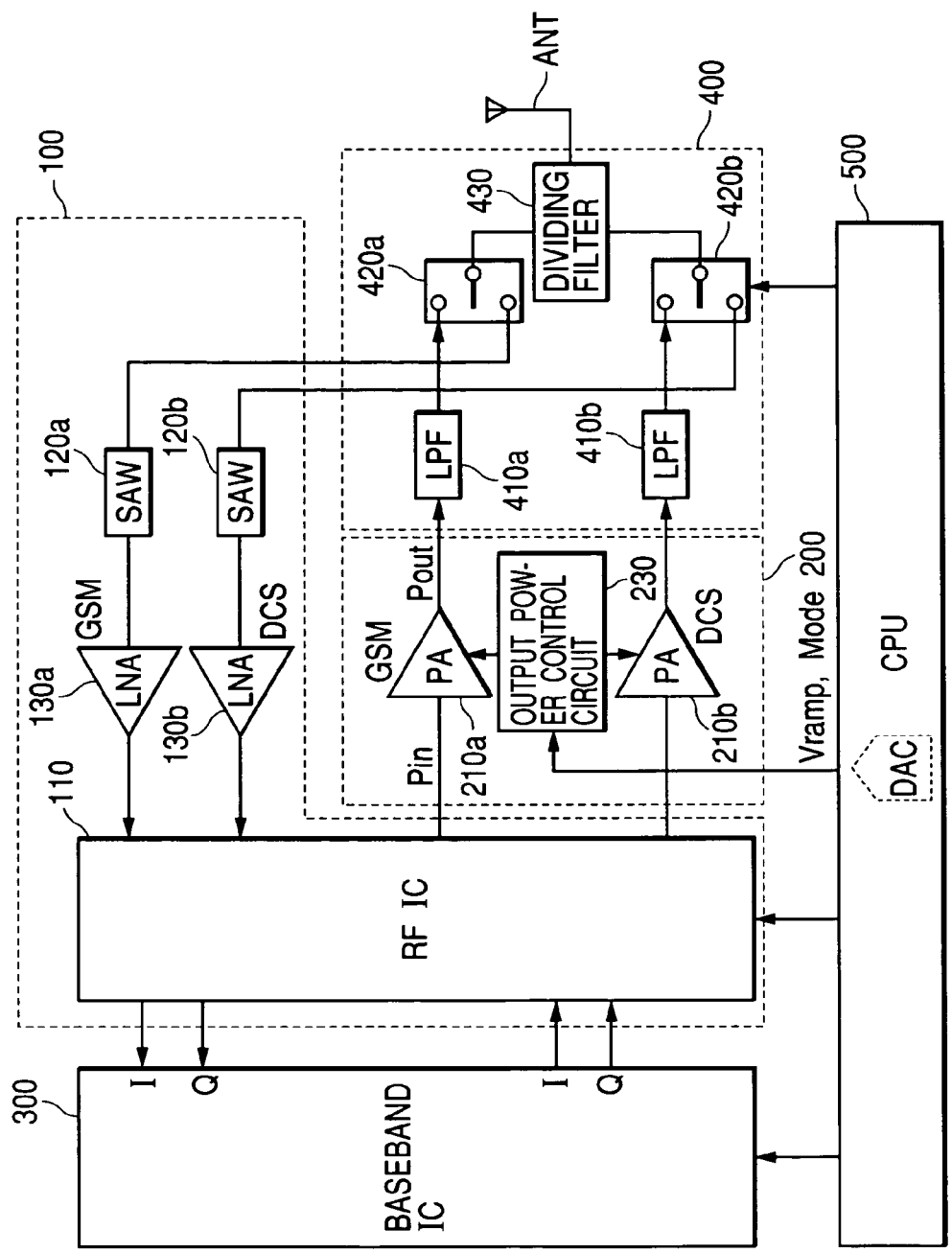
FIG. 11 is a block diagram illustrating the configuration of a system capable of radio communication by two transmission methods, GSM and DCS, to which the present invention is applied.

FIG. 11 schematically illustrates the configuration of a dual band communication system as an example of a radio communication system to which the present invention is applied. This communication system is capable of radio communication by two transmission methods: GSM (Global System for Mobile Communication) which uses a frequency in the 900-MHz band, and DCS (Digital Cellular System) which uses a frequency in the 1800-MHz band.

The radio communication system in FIG. 11 comprises a high frequency module (hereafter, referred to as "RF module") 100; a module for high frequency power amplifier (hereafter, referred to as "power module") 200; a baseband circuit 300; a front end module 400; and a microprocessor (CPU) 500. The RF module 100 is formed by mounting on one ceramic substrate a high frequency signal processing circuit (high frequency IC) 110 constituted as a semiconductor integrated circuit having a modulation-demodulation circuit capable of GMSK modulation and demodulation in the GSM and DCS systems; a band pass filter SAW 120a, 120b comprising an elastic surface-wave filter which removes unwanted waves from reception signals; a low noise amplifier LNA 130a, 130b which amplifies reception signals; and the like. The power module 200 includes high frequency power amplification circuits (power amplifiers) 210a, 210b which drive an antenna ANT as load to carry out transmission; an output power control circuit 230; and the like. The microprocessor (CPU) 500 is a controller which controls the entire system.

The baseband circuit 300 is provided with a baseband processing function for generating I- and Q-signals based on transmission data (baseband signal) and processing I- and Q-signals extracted from reception signals. The baseband circuit 300 is constituted as a semiconductor integrated circuit. Hereafter, this is referred to as "baseband IC." The front end module 400 contains filters LPF 410a, 410b which suppress noise, such as harmonics, contained in transmission signals outputted from the RF power module 200; transmission/reception changeover switches 420a and 420b; a dividing filter 430; and the like. The microprocessor (CPU) 500 generates control signals for the high frequency IC 110 and the baseband IC 300 and output level instruction signals Vramp for the power module 200.

The current detection circuit 20, square root conversion circuit 30 (or logarithmic conversion circuit), current-voltage conversion circuit 40, and error amplifier 50 in FIG. 9 are expressed in one block as the output power control circuit 230 in the FIG. 11.

As illustrated in FIG. 11, the radio communication system in this embodiment is provided in the power module 200 with a power amplifier 210a and a power amplifier 210b. The power amplifier 210a amplifies transmission signals on 900 MHz which is a frequency band for GSM, and the power amplifier 210b amplifies transmission signals on 1800 MHz which is a frequency band for DCS. Similarly, the radio communication system is provided in the RF module 100 with a SAW filter 120a and a low noise amplifier 130a for GSM and a SAW filter 120b and a low noise amplifier 130b for DCS.

In the high frequency IC 110, GMSK modulation is carried out, and carrier waves are phase-modulated according to information to be transmitted. The phase-modulated signal is inputted as high frequency signal Pin to the power module 200, and amplified there. In this embodiment, in addition to the modulation circuit for transmission, the high frequency IC 110 includes a reception system circuit. The reception system circuit comprises a mixer for downconverting reception signals into signals of a lower frequency; a high-gain programmable gain amplifier; and the like. However, the constitution of the high frequency IC 110 is not limited to this. The low noise amplifiers LNA may be built in the high frequency IC 110.

The front end module 400 is provided with a low pass filter 410a for GSM; a low pass filter 410b for DCS; the changeover switch 420a for switching between transmission and reception in GSM; the changeover switch 420b for switching between transmission and reception in DCS; the dividing filter 430 which is connected with the antenna ANT and separates signals for GSM and signals for DCS from reception signals. Signals for controlling switching by the changeover switches 420a and 420b are supplied from the CPU 500. The power module 200 or the front end module 400 is provided with impedance matching circuits though they are not shown in FIG. 11. The impedance matching circuits are placed between the output terminals of the power amplifiers 210a and 210b or the transmission output terminals of the power module 200 and the low pass filters 410a and 410b, and carry out impedance matching.

In such a dual band communication system for GSM and DCS as mentioned above, the maximum levels of the output power of the GSM-side power amplifier 210a and the output power of the DCS-side power amplifier 210b are defined by technical standards and different from each other. However, the square root conversion circuit 30, current-voltage conversion circuit (sensing resistor) 40, and error amplifier 50 can be used in both the two bands. This is done by appropriately setting the size ratio between the transistor TR3 for high frequency power amplifier and the transistor TR4 for output detection in the current detection circuit 20 and the size ratio between the transistors TR5 and TR6 constituting current mirror circuits. A mode control signal Mode which instructs which power amplifier 210a or 210b should be operated is supplied from the CPU 500 to the power module 200.

Up to this point, the invention made by the inventors has been described based on the embodiments. However, the present invention is not limited to the above embodiments, and may be modified in various ways to the extent that its scope is not departed from, needless to add. Some examples are as follows. In the above embodiments, the square root conversion circuit 30 is provided between the current detection circuit 20 and the current-voltage conversion circuit 40. Instead of the square root conversion circuit 30, an nth root conversion circuit (n is an integer not less than 2) or a logarithmic conversion circuit may be provided. Instead of provision of an nth root conversion circuit or a logarithmic conversion circuit, the following constitution may be adopted: the current detection circuit 20 or the current-voltage conversion circuit 40 is provided with such a characteristic that its output is nth root-functionally or logarithmic-functionally changed relative to its input. In the high frequency power amplification circuit in the above embodiments, the power amplifying FETs are connected in three stages. However, a constitution may be adopted whereby they are connected in two stages or four or more stages.

The above description is made mainly with respect to the following case: the invention made by the inventors is applied to a power module constituting a dual mode radio communication system capable of transmission and reception by two communication methods, GSM and DCS. This is the field of utilization in which the present invention has been made. However, the present invention is not limited to this, and may be utilized in other power modules. An example is a power module constituting a radio communication system capable of transmission and reception by any other communication method. Another example is a power module constituting a radio communication system, such as multimode cellular phone and mobile radiophone, capable of transmission and reception by three or more different communication methods, for example, GMS, DCS, and PCS (Personal Communications System).

Effects produced according to the representative aspects of the present invention will be briefly described below.

According to the present invention, in a radio communication system which carries out by current detection the detection of output level required for feedback control of the output power of a high frequency power amplification circuit, the stability of control loop and the response to change in request-to-send level can be enhanced.

Further, according to the present invention, in a radio communication system which carries out by current detection the detection of output level required for feedback control of the output power of a high frequency power amplification circuit, the control sensitivity is lowered in a region where the request-to-send level is low, and the output level can be controlled with accuracy over the entire control range. Further, the stability of control loop and the response to change in request-to-send level can be enhanced.

What is claimed is:

1. A semiconductor integrated circuit for high frequency power amplifier comprising a semiconductor chip,
wherein said semiconductor chip includes thereover:
a current detection circuit having a transistor for output detection which receives a signal from a power amplification circuit for amplifying modulated high frequency signals and detects the current of the power amplification circuit;
a current-voltage conversion circuit which converts the detection current of the current detection circuit into voltage;
an error amplification circuit which compares the voltage obtained by conversion by the current-voltage conversion circuit with an output level instruction signal and outputs a signal corresponding to the difference between them; and a bias generation circuit which supplies bias to said power amplification circuit based on the output of the error amplification circuit, and wherein said error amplification circuit includes: a differential amplification circuit; a first resistance element; a second resistance element; and a capacitive element, the second resistance element and the capacitive element being connected in series in parallel with the first resistance element, and the first resistance element, the second resistance element, and the capacitive element being connected between the output terminal and inverting input terminal of the differential amplification circuit.

2. The semiconductor integrated circuit for high frequency power amplifier according to claim 1, wherein said current-voltage conversion circuit is a square root conversion circuit which converts an input current into a current which is the square root of the input current.

3. The semiconductor integrated circuit for high frequency power amplifier according to claim 2, wherein said square root conversion circuit is a circuit which comprises field-effect transistors, is fed with said detection current and a reference current as input signals, and outputs a current which is the square root of the product of the detection current and the reference current.

4. The semiconductor integrated circuit for high frequency power amplifier according to claim 1, wherein the noninverting input terminal of said error amplification circuit is provided with an attenuator, and voltage obtained by dividing said output level instruction signal by the attenuator is inputted.

5. The semiconductor integrated circuit for high frequency power amplifier according to claim 1, wherein said bias generation circuit is a resistance type voltage division circuit comprising a plurality of resistance elements.

6. An electronic component for high frequency power amplifier comprising an insulating substrate, wherein said insulating substrate includes thereover:

a power amplification circuit which amplifies modulated high frequency signals;

a current detection circuit having a transistor for output detection which receives a signal from the power amplification circuit and detects the current of the power amplification circuit;

a current-voltage conversion circuit which converts the detection current of the current detection circuit into voltage;

an error amplification circuit which compares the voltage obtained by conversion by the current-voltage conversion circuit with an output level instruction signal and outputs a signal corresponding to the difference between them; and a bias generation circuit which supplies bias to said power amplification circuit based on the output of the error amplification circuit, and wherein said error amplification circuit includes: a differential amplification circuit; a first resistance element; a second resistance element; and a capacitive element, the second resistance element and the capacitive element being connected in series in parallel with the first resistance element, and the first resistance element, the second resistance element, and the capacitive element being connected between the output terminal and inverting input terminal of the differential amplification circuit.

7. The electronic component for high frequency power amplifier according to claim 6, wherein said power amplification circuit comprises a plurality of transistors for power amplifier in cascade connection, and said current detection circuit receives the input signal of the transistor for power amplifier in the final stage and outputs a current in proportion to the output current.

8. The electronic component for high frequency power amplifier according to claim 7, wherein an impedance matching circuit is provided between the input terminal and the transistor for power amplifier in the first stage, between the transistors for power amplifier in the individual stages, and between the transistor for power amplifier in the final stage and the output terminal, wherein said transistors for power amplifier, said current detection circuit, the current-voltage conversion circuit, and the error amplification circuit are formed over one or more semiconductor chips, and wherein said impedance matching circuits are formed over an insulating substrate over which said semiconductor chips are mounted.

9. The electronic component for high frequency power amplifier according to claim 6, wherein said current-voltage conversion circuit is a square root conversion circuit which converts an input current into a current which is the square root of the input current.

10. The electronic component for high frequency power amplifier according to claim 6, wherein the noninverting input terminal of said error amplification circuit is provided with an attenuator, and voltage obtained by dividing said output level instruction signal by the attenuator is inputted.

11. A radio communication systems comprising:

a first electronic component for high frequency power amplifier comprising an insulating substrate, wherein said insulating substrate includes thereover: a power amplification circuit which amplifies modulated high frequency signals; a current detection circuit having a transistor for output detection which receives a signal from the power amplification circuit and detects the current of the power amplification circuit; a current-voltage conversion circuit which converts the detection current of the current detection circuit into voltage; an error amplification circuit which compares the voltage obtained by the current-voltage conversion circuit with an output level instruction signal and outputs a signal corresponding to the difference between them; and a bias generation circuit which supplies bias to said power amplification circuit based on the output of the error amplification circuit, and wherein said error amplification circuit includes: a differential amplification circuit; a first resistance element; a second resistance element; and a capacitive element, the second resistance element and the capacitive element being connected in series in parallel with the first resistance element, and the first resistance element, the second resistance element, and the capacitive element being connected between the output terminal and inverting input terminal of the differential amplification circuit;

a second electronic component comprising a transmission/reception changeover circuit which switches between transmission signal and reception signal;

a third electronic component which modulates a signal to be transmitted and inputs the signal to said first electronic component for high frequency power amplifier; and a controller for generating and supplying a control signal to each of said electronic components, wherein said output level instruction signal is supplied from said controller to said first electronic component for high frequency power amplifier.

12. The radio communication system according to claim 11, wherein said first electronic component for high frequency power amplifier further comprises a first power amplification circuit for amplifying signals in a first frequency band and a second power amplification circuit for amplifying signals in a second frequency band, said second electronic component further comprises a signal changeover means which switches between signals in the first frequency band and signals in the second frequency band; said third electronic component further comprises a circuit for modulating signals in the first frequency band and a circuit for modulating signals in the second frequency band, and at least said current detection circuit, said current-voltage conversion circuit, and said error amplification circuit are provided as circuits common to said first power amplification circuit and said second power amplification circuit.

13. The radio communication system according to claim 12, wherein a changeover signal for controlling the state of said transmission/reception changeover circuit is supplied from said controller to said second electronic component, and a signal for controlling the operating state of said first power amplification circuit and said second power amplification circuit in said first electronic component for high frequency power amplifier according to said changeover signal is supplied from said controller to said first electronic component for high frequency power amplifier.

* * * * *